(12) United States Patent
Dutta et al.

(10) Patent No.: US 11,361,987 B2
(45) Date of Patent: Jun. 14, 2022

(54) FORMING DECOUPLED INTERCONNECTS

(71) Applicant: International Business Machines Corporation, Armonk, NY (US)

(72) Inventors: Ashim Dutta, Menands, NY (US); Saumya Sharma, Albany, NY (US); Tianji Zhou, Albany, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 76 days.

(21) Appl. No.: 16/874,658

(22) Filed: May 14, 2020

(65) Prior Publication Data
US 2021/0358801 A1    Nov. 18, 2021

(51) Int. Cl.
*H01L 21/768*    (2006.01)
*H01L 23/522*    (2006.01)
*H01L 23/528*    (2006.01)

(52) U.S. Cl.
CPC .. *H01L 21/76816* (2013.01); *H01L 21/76834* (2013.01); *H01L 21/76843* (2013.01); *H01L 21/76877* (2013.01); *H01L 23/528* (2013.01); *H01L 23/5226* (2013.01)

(58) Field of Classification Search
CPC ......... H01L 21/76816; H01L 21/76834; H01L 21/76843; H01L 21/76877; H01L 23/5226; H01L 23/528
USPC ....................................................... 257/758
See application file for complete search history.

(56) References Cited

U.S. PATENT DOCUMENTS

| | | |
|---|---|---|
| 3,808,680 A | 5/1974 | Lafrate |
| 5,470,788 A | 11/1995 | Biery |
| 5,691,238 A | 11/1997 | Avanzino |
| 5,773,365 A | 6/1998 | Ito |
| 5,804,458 A | 9/1998 | Tehrani et al. |
| 6,365,419 B1 | 4/2002 | Durlam et al. |
| 6,475,857 B1 | 11/2002 | Kim et al. |
| 7,790,617 B2 | 9/2010 | Lim |

(Continued)

FOREIGN PATENT DOCUMENTS

WO    2015026390    2/2015

OTHER PUBLICATIONS

Jiang et al., "Development of electroless Co via-prefill to enable advanced BEOL metallization and via resistance reduction." In 2016 IEEE International Interconnect Technology Conference/Advanced Metallization Conference (IITC/AMC), pp. 111-113. IEEE, 2016.

(Continued)

*Primary Examiner* — Caleen O Sullivan
(74) *Attorney, Agent, or Firm* — L. Jeffrey Kelly; Otterstedt, Wallace & Kammer, LLP

(57) ABSTRACT

A method for making a semiconductor apparatus includes forming a first bottom interconnect in a device area of a first dielectric layer; fabricating a device on top of the first bottom interconnect; capping the device with a first interlayer dielectric; exposing a logic area of the first dielectric layer that is adjacent to the device area by removing a portion of the first interlayer dielectric from the first dielectric layer while leaving another portion of the first interlayer dielectric that caps the device; and forming a second bottom interconnect in the logic area of the first dielectric layer. By forming the second bottom interconnect after the device fabrication and capping, damage to the device and to the second bottom interconnect is avoided.

13 Claims, 12 Drawing Sheets

(56) References Cited

U.S. PATENT DOCUMENTS

| | | |
|---|---|---|
| 8,357,609 B2 | 1/2013 | Ryan |
| 8,796,854 B2 | 8/2014 | Yang |
| 9,236,342 B2 | 1/2016 | Bristol |
| 9,601,426 B1 | 3/2017 | Bonilla et al. |
| 9,613,861 B2 | 4/2017 | Anderson |
| 9,793,206 B1 | 10/2017 | Briggs et al. |
| 9,893,278 B1 | 2/2018 | Chuang et al. |
| 10,361,364 B2 | 7/2019 | Clevenger et al. |
| 2001/0050385 A1 | 12/2001 | Kotecki |
| 2008/0293165 A1 | 11/2008 | Ranjan et al. |
| 2012/0080793 A1 | 4/2012 | Danek |
| 2013/0026635 A1 | 1/2013 | Yang |
| 2014/0284801 A1 | 9/2014 | Kitamura et al. |
| 2014/0291819 A1 | 10/2014 | Barth |
| 2014/0332963 A1 | 11/2014 | Filippi et al. |
| 2014/0332965 A1 | 11/2014 | Bao et al. |
| 2015/0171314 A1 | 6/2015 | Li et al. |
| 2016/0163587 A1 | 6/2016 | Backes et al. |
| 2016/0365505 A1 | 12/2016 | Lu et al. |
| 2017/0040213 A1 | 2/2017 | Bruce et al. |
| 2017/0069684 A1 | 3/2017 | Suh et al. |
| 2017/0084820 A1 | 3/2017 | Tan et al. |
| 2017/0092693 A1 | 3/2017 | Tan et al. |
| 2018/0040817 A1 | 2/2018 | Chuang et al. |
| 2018/0090372 A1 | 3/2018 | Briggs et al. |
| 2018/0197915 A1 | 7/2018 | Briggs et al. |
| 2018/0366640 A1 | 12/2018 | Jiang |
| 2019/0081233 A1 | 3/2019 | Lee et al. |
| 2019/0165042 A1 | 5/2019 | Clevenger et al. |
| 2019/0214554 A1 | 7/2019 | Li et al. |
| 2019/0326509 A1 | 10/2019 | Yi et al. |

OTHER PUBLICATIONS

Anonymous, "Hybrid refractory metal-copper wiring metallization scheme for integrated circuits", IPCOM000223293D, Nov. 15, 2012.

FORMING DECOUPLED INTERCONNECTS

BACKGROUND

The present invention relates to the electrical and electronic arts, and more specifically, to fabricating the back-end-of-line (BEOL) components of integrated circuits.

As integrated circuits move to smaller technology nodes, simultaneous patterning of interconnect(s) and devices in various areas of a die becomes increasingly challenging. Some of the main process challenges include seams and voids in dielectric fill, dielectric and metal damage causing high resistive-capacitive (RC) delays, metal sidewall damage, and dielectric cap damage causing electromigration.

SUMMARY

Principles of the invention provide techniques for forming decoupled interconnects. In one aspect, an exemplary method includes forming a first bottom interconnect in a device area of a first dielectric layer; fabricating a device on top of the first bottom interconnect; capping the device with a first interlayer dielectric; exposing a logic area of the first dielectric layer that is adjacent to the device area by removing a portion of the first interlayer dielectric from the first dielectric layer while leaving another portion of the first interlayer dielectric that caps the device; and forming a second bottom interconnect in the logic area of the first dielectric layer.

According to another aspect, an exemplary semiconductor apparatus includes a first dielectric layer that has a device area and a logic area adjacent to the device area; a first bottom interconnect formed in the device area of the first dielectric layer; a device on top of the first bottom interconnect; a first interlayer dielectric capping the device but not covering the logic area; and a second bottom interconnect formed in the first dielectric layer in the logic area. The distance from the first bottom interconnect to the top of the first interlayer dielectric defines a device layer of the apparatus.

According to another aspect, an exemplary semiconductor apparatus includes a first dielectric layer that has a device area and a logic area adjacent to the device area; a first bottom interconnect formed in the device area; a device on top of the first bottom interconnect; a first interlayer dielectric capping the device; and a stack of interconnects formed above the logic area adjacent the device. The distance from the first bottom interconnect to the top of the first interlayer dielectric defines a device layer of the apparatus. The stack of interconnects comprises multiple layers of interconnects and dielectric caps within the device layer.

In view of the foregoing, techniques of the present invention can provide substantial beneficial technical effects. For example, one or more embodiments provide one or more of:

A run-path for interconnect manufacturability as fabrication progresses to smaller technology nodes.

By forming the second bottom interconnect after the device fabrication and capping, damage to the device and to the second bottom interconnect is avoided. Thus, damage prevention for cap dielectric and bottom interconnect metal while patterning the memory stack or other local interconnects, indirectly improving device reliability with low resistance-capacitance (RC) timing delay.

Easy implementation of decoupled interconnect for several device sizes and design variants.

Logic to support 10x memory devices in fewer than 10x layers (x number of memory devices in a particular level or plane can be interconnected with an unrelated y number of logic levels or planes for optimized architecture or reducing the overall size of the final chip).

These and other features and advantages of the present invention will become apparent from the following detailed description of illustrative embodiments thereof, which is to be read in connection with the accompanying drawings.

DETAILED DESCRIPTION

Figure 1:
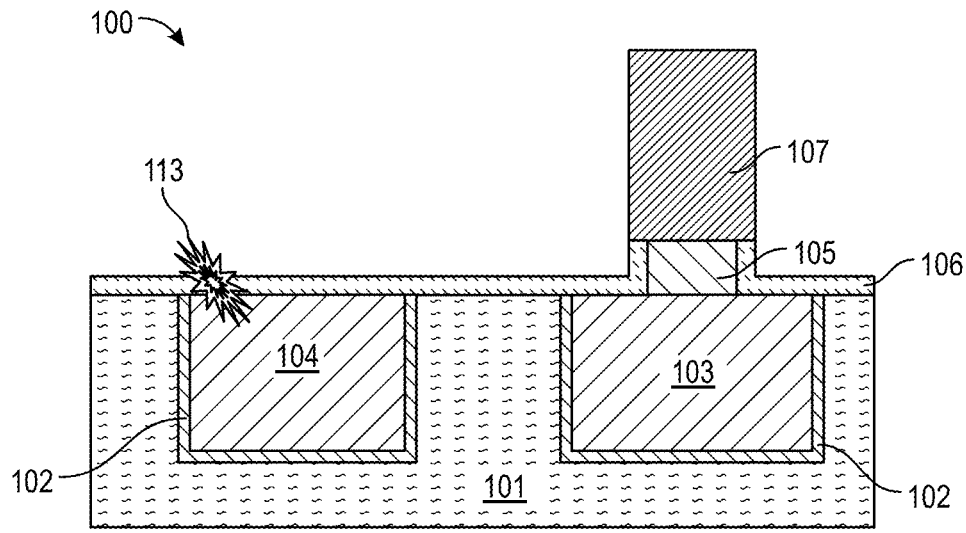
FIG. 1 depicts in a schematic a conventional integrated circuit including a device and bottom interconnects in a dielectric substrate.

As shown in FIG. 1, a conventional integrated circuit 100 includes a first dielectric layer 101 that is lined with a metal liner 102 around interconnects 103, 104. The interconnects 103, 104 are formed at the same time, followed by fabrication of a metal plug 105, an insulator layer 106, and a device 107. The process of fabricating the device 107 after forming the interconnect 104 and the insulator layer 106 can lead to forming a defect 113 in the insulator layer overlying the interconnect 104, e.g., due to excessive etching during device fabrication.

Figure 2:
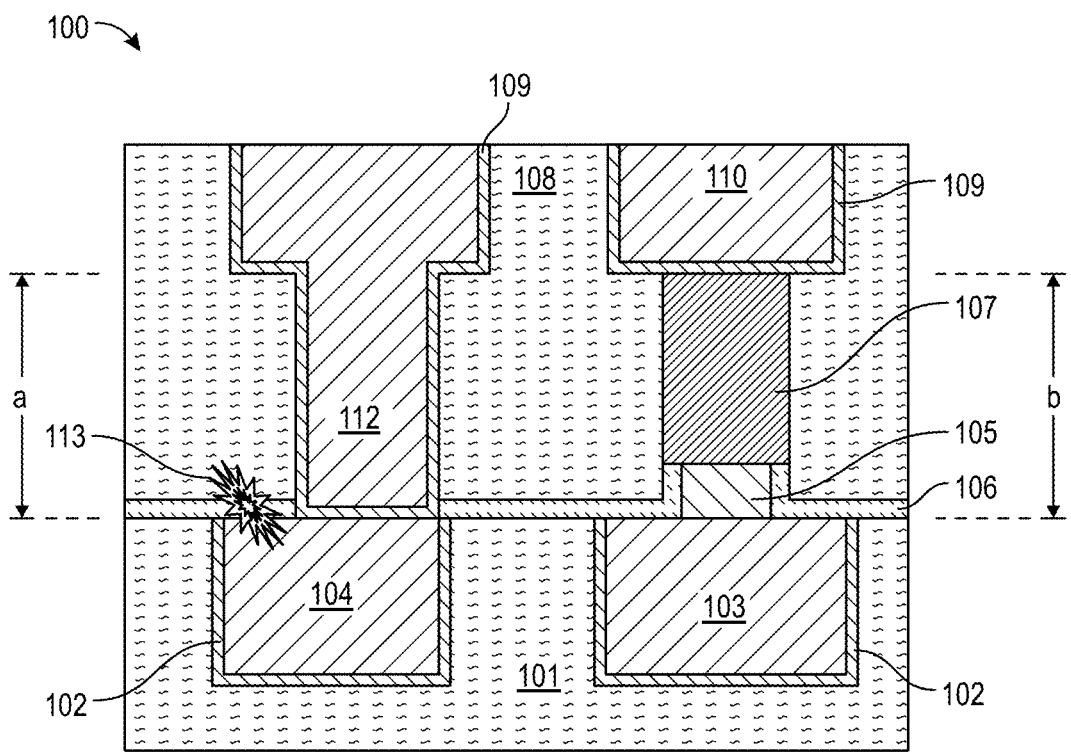
FIG. 2 depicts in a schematic the conventional device and interconnects of FIG. 1 with additional structure.

FIG. 2 depicts a later stage in fabrication of the integrated circuit 100, in which an interlayer dielectric 108 has been put down and lined with a metal liner 109 around interconnects 110, 112. The defect 113 is captured under the interlayer dielectric 108 and cannot be repaired, but presents a real possibility of the circuit not performing as expected. Accordingly, it is desirable to produce an integrated circuit in which such defects are not formed during device fabrication.

Additionally, it is desirable to produce an integrated circuit in which multiple layers of interconnect can be accommodated in the same height as a single device. Note that in conventional circuits as shown in FIG. 2, an interlayer height "a" associated with the interconnect 112 is equal to an interlayer height "b" associated with the device 107. By contrast, as will be discussed with reference to FIG. 3, aspects of the invention provide circuits with different interlayer heights at different areas of the circuits.

One or more embodiments of the invention achieve these and/or other goals in the following manner. One or more interconnect patterning steps including trench or/and via formation are carried out separate from device patterning or other interconnect patterning so that different portions of a layer are put down at different times and are of different depths or heights. Dielectric fill and metal trench or via structures are not impacted by nearby patterning of interconnect(s) or device(s) because one or more interconnect fabrication processes are performed after nearby interconnect/device patterning is done. Interconnects that are formed later use a selective bottom up metal fill process to form lower level metal lines.

In one or more embodiments, a resultant structure includes one or more interconnect patterns with materials different from other interconnects, as well as areas of the die in which interlayer dielectric separation distance differs from other areas of the die. Metal lines in a given area of the die are at a different height or level than metal lines at the same layer in another area of the die.

Accordingly, in one or more embodiments a device can be scaled separately from adjacent interconnect(s), allowing more interconnect layers to be packed in a given volume even if the device cannot be scaled to smaller dimensions. Thus, the separate patterning of the interconnect (i.e. not combined with device patterning) can prevent any damage to the device on the same or neighboring layers during fabrication of the interconnect.

Figure 3:
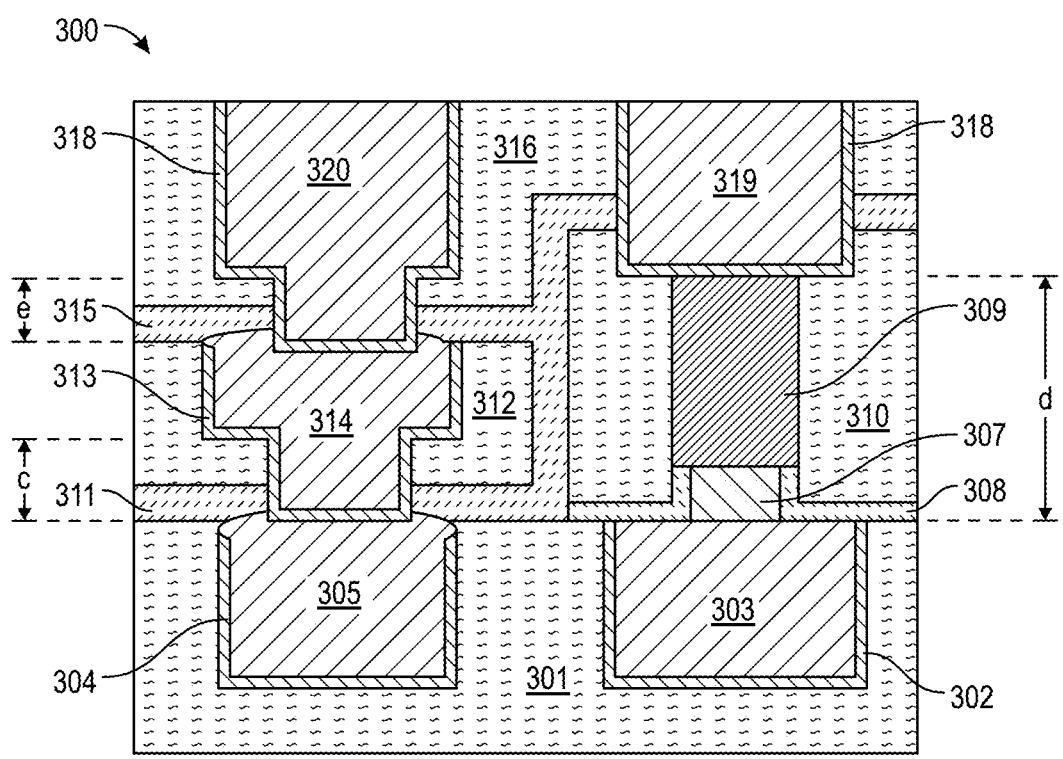
FIG. 3 depicts in a schematic an integrated circuit with a device alongside multi-layer interconnects, according to an exemplary embodiment.

Thus, FIG. 3 depicts in a schematic an integrated circuit 300 with multi-layer interconnects 305, 314, 320, according to an exemplary embodiment. The circuit 300 includes a first dielectric layer 301 in which metal liners 302, 304 are formed with first and second bottom interconnects 303, 305 formed inside the liners. A metal plug 307 connects the first bottom interconnect 303 through an insulator 308 to a device 309 that is encapsulated in a first interlayer dielectric 310. As mentioned above, and as discussed below with reference to FIG. 4, the second bottom interconnect 305 is formed after fabrication of the device 309. This ordering of steps prevents damage to the second bottom interconnect 305 during fabrication of the device 309.

The first interlayer dielectric 310 is covered by a dielectric cap layer 311, which separates the first interlayer dielectric from a second interlayer dielectric 312. A third metal liner 313 and a third interconnect 314 are formed in the second interlayer dielectric 312. During formation of the third metal liner 313 and the third interconnect 314, the first dielectric cap layer 311 protects the device 309 from the process chemistry and the like. A second dielectric cap layer 315 separates the second interlayer dielectric 312 from a third interlayer dielectric 316, in which a fourth metal liner 318 is formed in two portions. A first upper interconnect 319 and a second upper interconnect 320 are formed in the fourth metal liner 318. The first upper interconnect 319 and the first bottom interconnect 303 are electrically connected with the device 309, while the second bottom interconnect 305 is electrically connected with the third interconnect 314 and with the second upper interconnect 320. In one or more embodiments, interlayer dimension "c" between the second bottom interconnect 305 and the third interconnect 314 is less than interlayer dimension "d" of the device 309; indeed, in one or more embodiments, dimension "d" is about equal to or even exceeds the sum of "c" with interlayer dimension "e" between the third interconnect 314 and the second upper interconnect 320. Notably, in one or more embodiments (not shown to avoid clutter), multiple "third" interconnects may be present within a layer defined by the height of the device 309.

In one or more embodiments, a distinction is made between dielectric cap layers and interlayer dielectrics. In one or more embodiments the interlayer dielectrics, which generally are thicker layers, have a relatively low dielectric constant k (k between about 1 and about 3) to accommodate resistance-capacitance (RC) timing concerns. On the other hand, in one or more embodiments the dielectric cap layers, which generally are thinner layers, have moderate k (between about 4 and about 7) to provide adequate protection (capping) against electromigration of metal from an underlying interconnect through the cap into the overlying interlayer dielectric.

Figure 4:
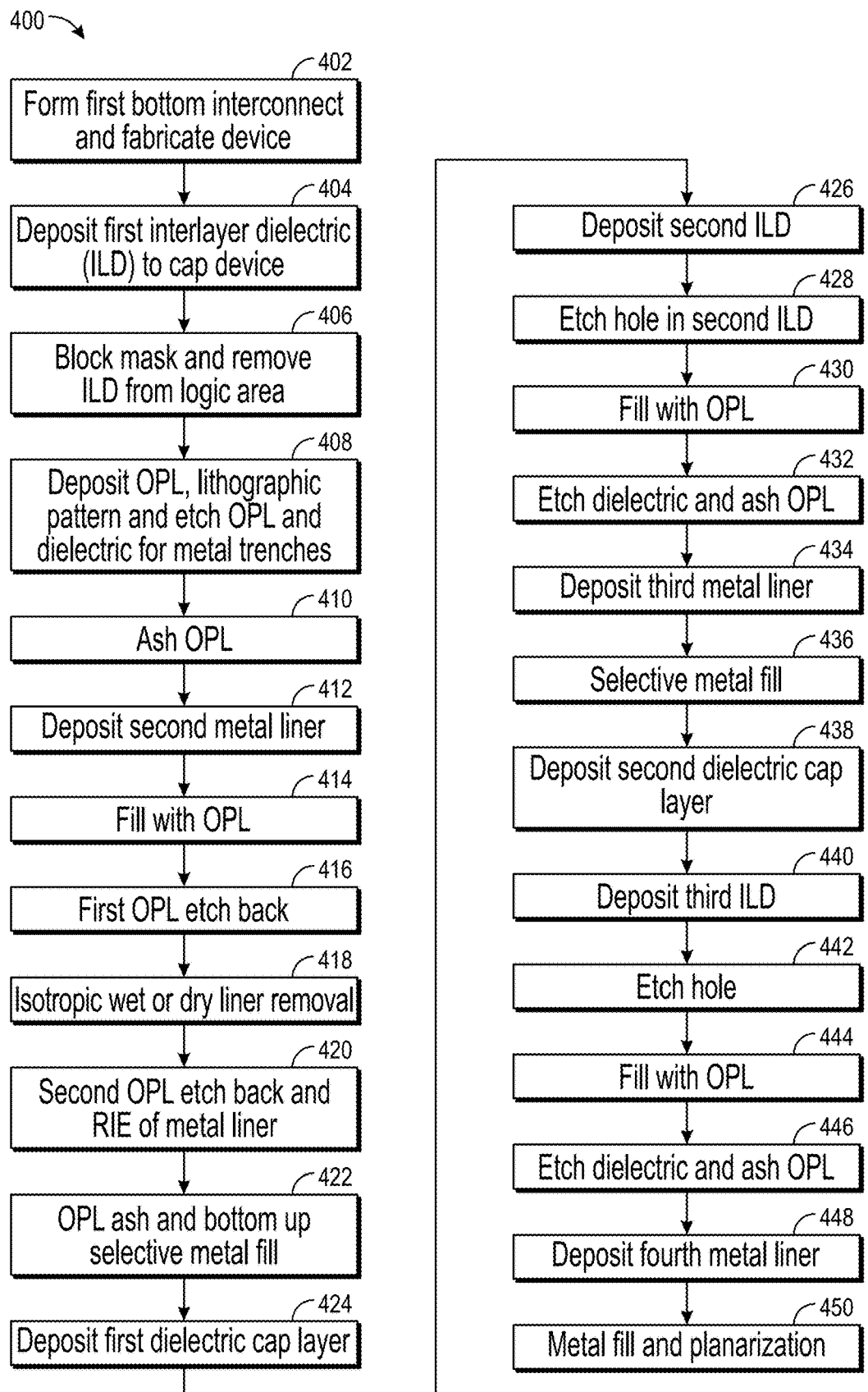
FIG. 4 depicts in a flowchart steps of a method for fabricating the integrated circuit of FIG. 3.

FIG. 4 depicts in a flowchart steps of a method 400 for fabricating the integrated device and multi-layer interconnects of FIG. 3. The steps of the method 400 will be discussed below with reference to FIG. 5 through FIG. 22, which depict in schematics some structures that are obtained after certain steps of the method 400. In one or more embodiments the steps are performed in the order stated below.

Figure 5:
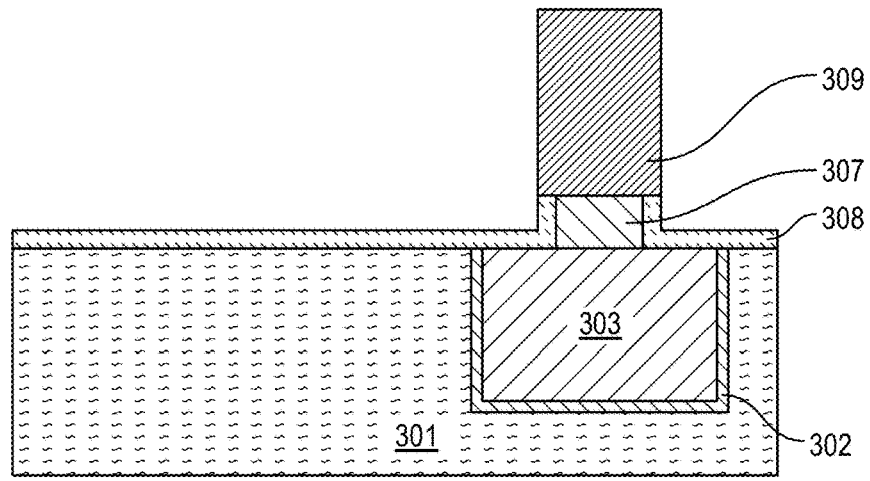
FIG. 5 depicts in a schematic a preliminary structure for performing the method of FIG. 4, with a device fabricated atop a first dielectric layer.

Referring to FIG. 4 and FIG. 5, at 402 obtain a substrate (the first dielectric layer 301), form the first bottom interconnect 303, and fabricate the device 309. Thus, this preliminary structure includes the first dielectric layer 301, the metal liner 302, the first bottom interconnect 303, the metal plug 307, the insulator layer 308, and the device 309. The metal liner 304 and the second bottom interconnect 305 are not yet included at this stage.

Figure 6:
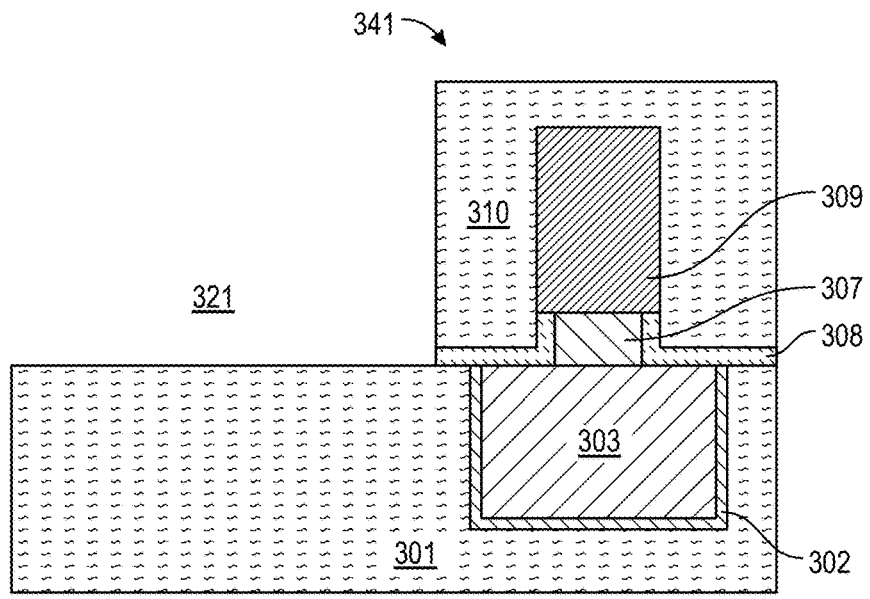
FIG. 6 depicts in a schematic the structure of FIG. 5 after capping a device with a dielectric and removing a portion of the dielectric.

Referring also to FIG. 6, at 404 deposit the first interlayer dielectric (ILD) 310 to encapsulate the device 309 and at 406 block mask and remove a portion of the first interlayer dielectric 310 from a logic area 321 adjacent to the device 309. The device 309 remains encapsulated by a remaining portion of the ILD 310 in a device area 341. Then at 408 deposit an organic planarization layer (OPL) 322, and carry out lithographic patterning and etching of the OPL 322 and the first dielectric layer 301 to form a trench 323.

Figure 7:
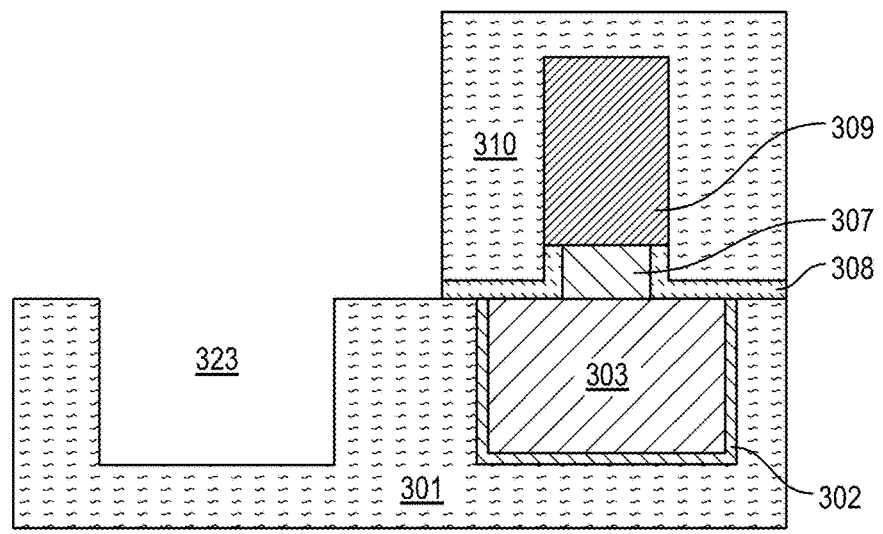
FIG. 7 depicts in a schematic the structure of FIG. 6 after etching a trench into the first dielectric layer.
Figure 8:
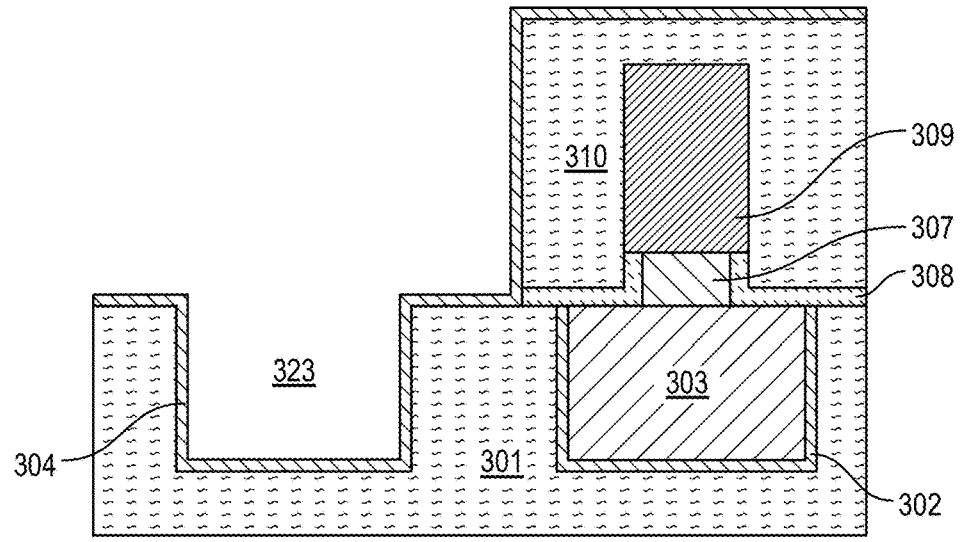
FIG. 8 depicts in a schematic the structure of FIG. 7 after lining the trench with a metal liner.

Referring also to FIG. 7, at 410 ash the OPL 322 of FIG. 8.

Referring also to FIG. 8, at 412 deposit the second metal liner 304. Then at 414 fill with an OPL 324, and at 416 partially etch back the OPL 324.

Figure 9:
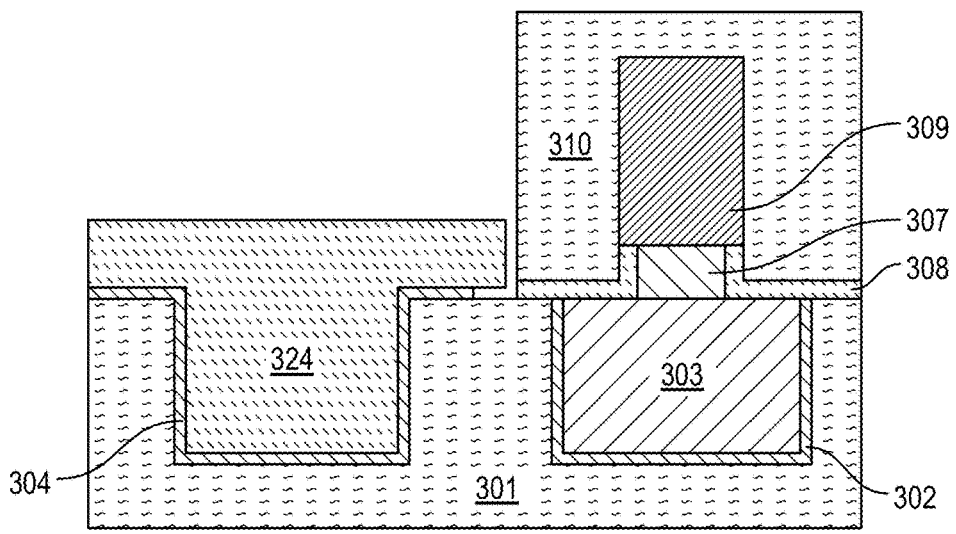
FIG. 9 depicts in a schematic the structure of FIG. 8 after filling the metal liner with an organic planarization layer (OPL) and etching back the OPL and the metal liner.

Referring also to FIG. 9, at 418 perform partial wet or dry removal of the second metal liner 304. In one or more embodiments, the removal of the second metal liner 304 is isotropic.

Figure 10:
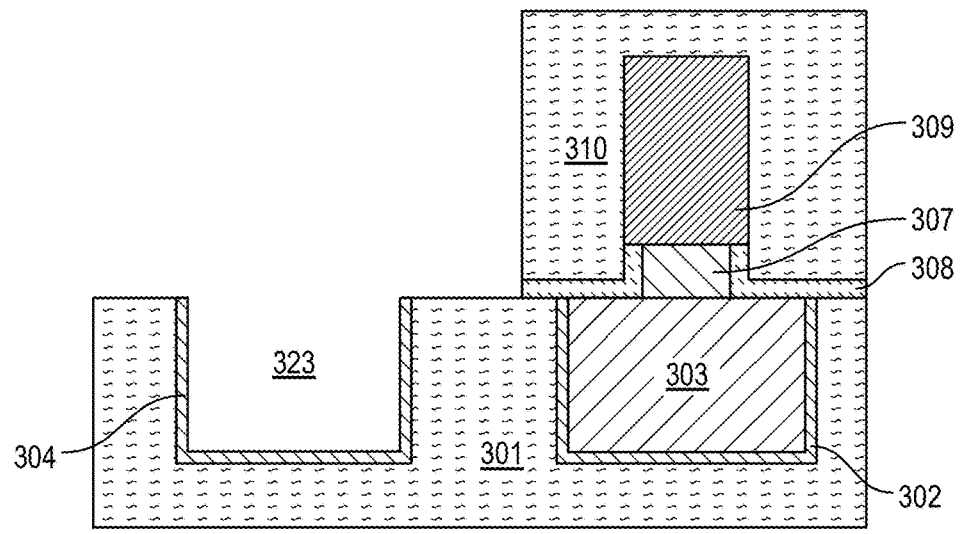
FIG. 10 depicts in a schematic the structure of FIG. 9 after ashing the OPL.
Figure 13:
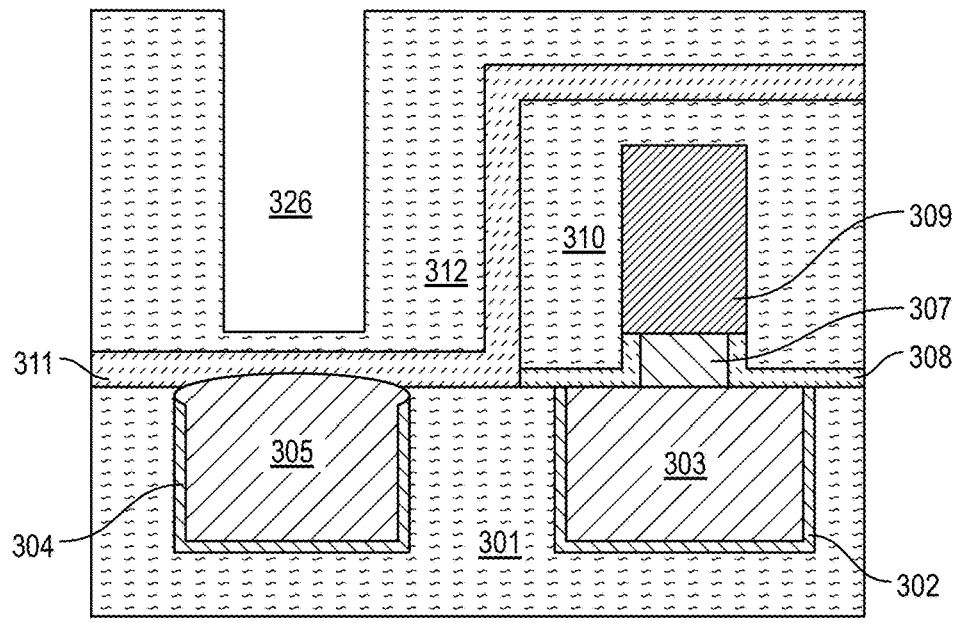
FIG. 13 depicts in a schematic the structure of FIG. 12 after etching a trench in the second interlayer dielectric.

Referring also to FIG. 10, at 420 etch the remaining OPL 324 of FIG. 13 down to the top of the trench 323 and reactive ion etch (RIE) the second metal liner 304.

Figure 11:
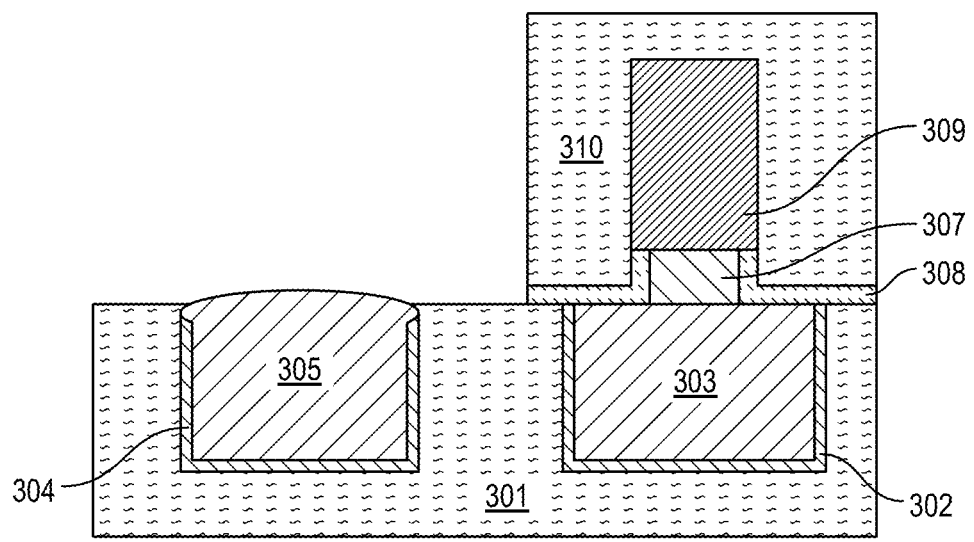
FIG. 11 depicts in a schematic the structure of FIG. 10 after filling the trench with interconnect metal to form a second bottom interconnect.

Referring also to FIG. 11, at 422 ash the OPL 324 that remains in the trench 323 above the liner 304, and selective metal fill the trench 323 from the bottom up to form the second bottom interconnect 305. The preceding steps prepare the structure so that the device 309 will not be damaged during metal fill of the second bottom interconnect 305. The reason why the OPL etch back is split into two steps, as in the first OPL etch back 416 and second OPL etch back 420, is for the first OPL etch 416 to remove the metal liner from the top of the memory stack or device 309 (as seen between FIGS. 12 and 13). Then there is a second OPL etch 420 down to the top of the trench; the metal liner 304 is removed from the right and left edges of the trench using some wet chemistry (FIG. 14); and the remaining OPL, which is all the OPL inside the trench 323, can be ashed away. Then at 424 deposit the first dielectric cap layer 311 over the first interlayer dielectric 310 and the second bottom interconnect 305.

Figure 12:
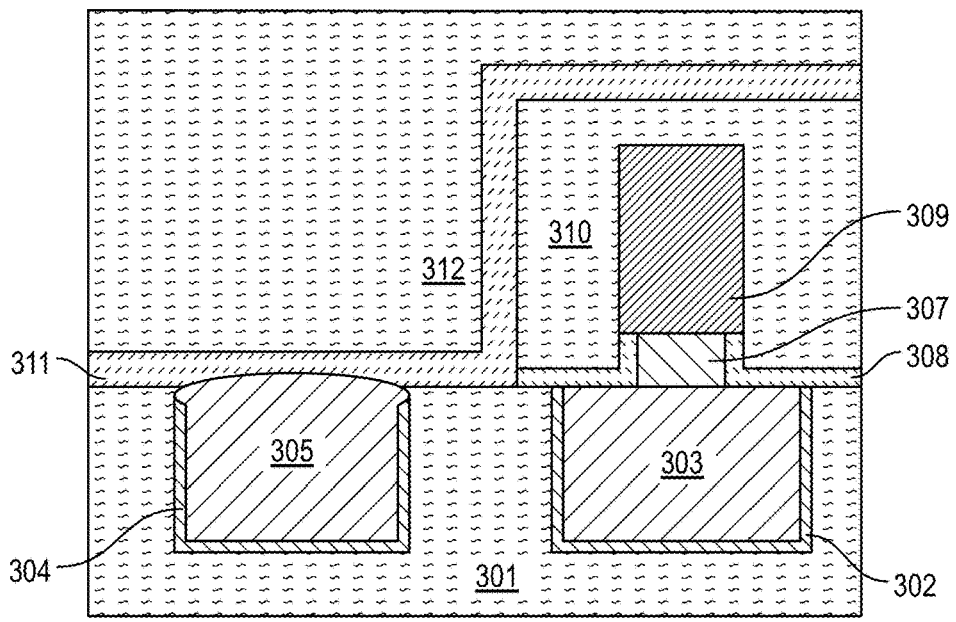
FIG. 12 depicts in a schematic the structure of FIG. 11 after capping the second bottom interconnect with a dielectric cap layer and a second interlayer dielectric.

Referring also to FIG. 12, at 426 deposit the second interlayer dielectric (ILD) 312 over the first dielectric cap layer 311.

Referring also to FIG. 13, at 428 etch a hole 326 into the second ILD 312.

Figure 14:
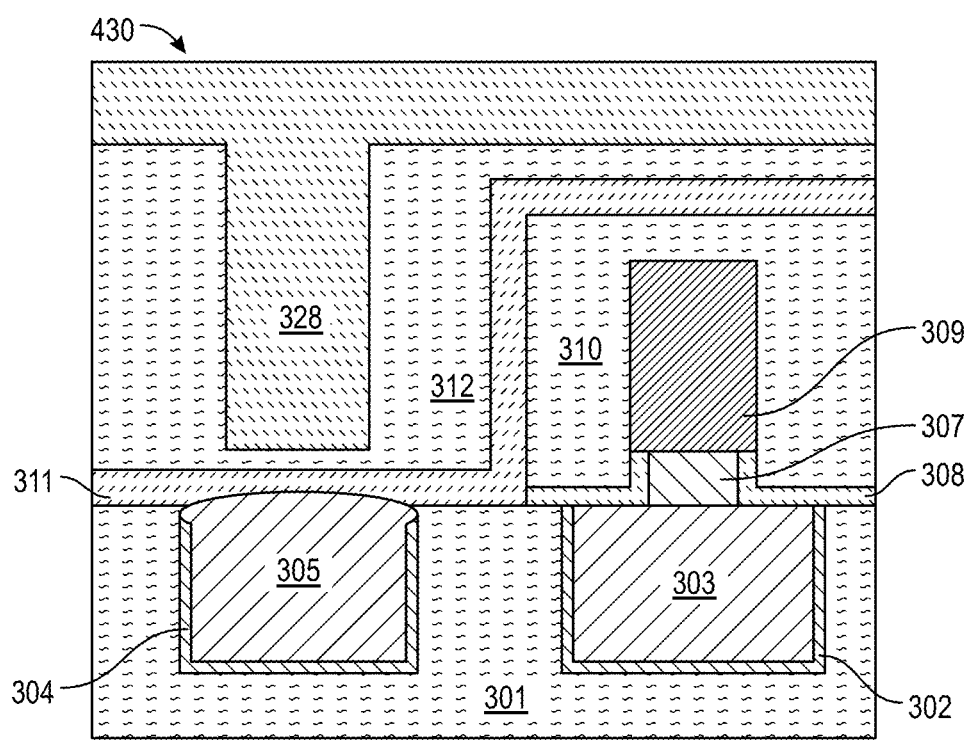
FIG. 14 depicts in a schematic the structure of FIG. 13 after filling the trench with an OPL.
Figure 18:
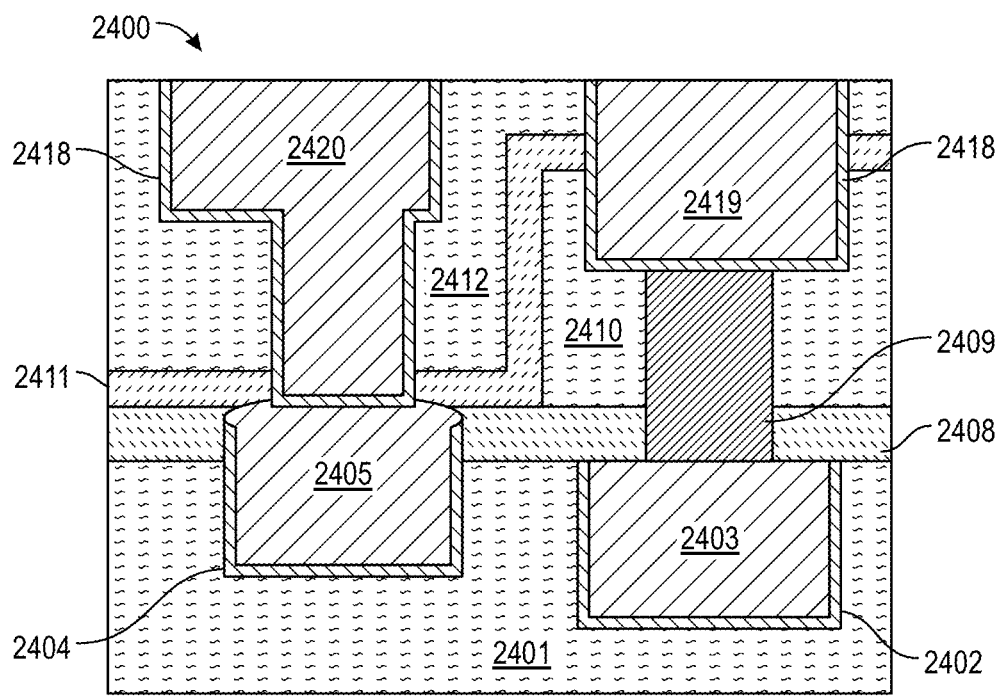
FIG. 18 depicts in a schematic an integrated circuit that includes a device and a vertically offset interconnect with a uniformly thick insulator layer and an intervening dielectric cap layer, according to an exemplary embodiment.

Referring also to FIG. 14, at 430 fill the hole 326 of FIG. 18 with an OPL 328. At 432 etch the dielectric 312 and ash the OPL 328 of FIG. 19 to form an upper via 329.

Figure 15:
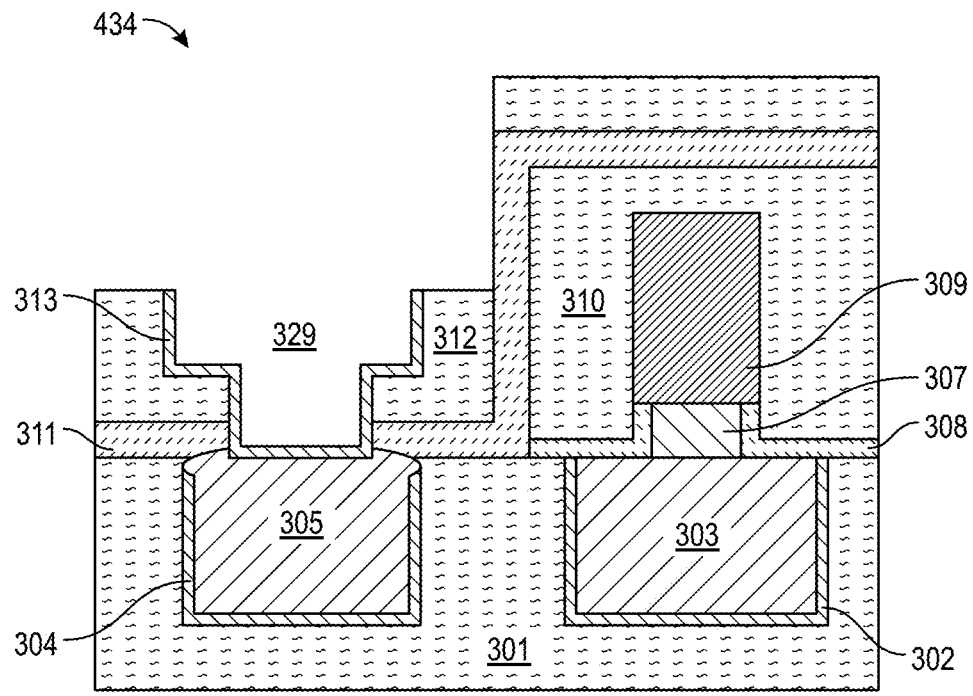
FIG. 15 depicts in a schematic the structure of FIG. 14 after etching an additional trench and lining the additional trench with a metal liner.
Figure 16:
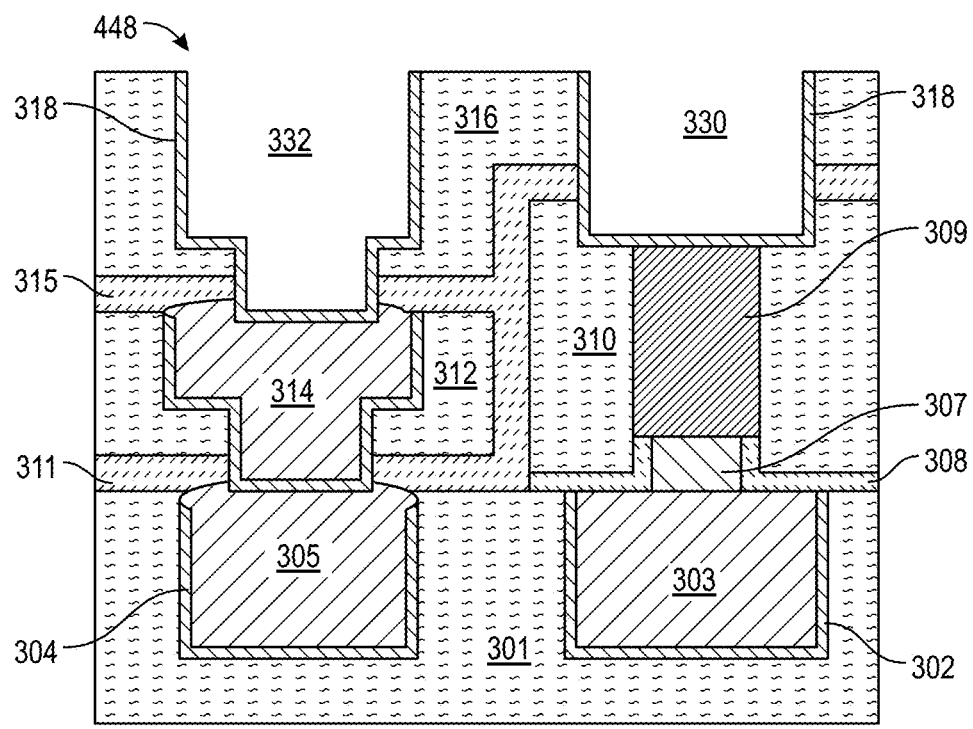
FIG. 16 depicts in a schematic the structure of FIG. 15 after repeating steps to form a third interconnect and metal-lined trenches above the third interconnect and the device.

Referring also to FIG. 15, at 434 deposit the third metal liner 313.

Several subsequent steps in the method 400 are substantially similar to those discussed above and are depicted in the flow chart but not in separate views. At 436, selective metal fill the third metal liner 313 to form the third interconnect 314. At 438, (after RIE of the third metal liner 313) deposit the second dielectric cap layer 315. At 440, deposit the third ILD 316. At 442, etch holes 330, 332 (seen in FIG. 22) into the third ILD 316. At 444, fill the holes 330, 332 with an OPL (not shown). At 446, etch the third ILD 316 and ash the OPL. At 448, referring also to FIG. 16, deposit the fourth metal liner 318.

At 450 as shown in FIG. 4, with reference also to FIG. 3, metal fill and planarize to form first and second upper interconnects 319, 320.

Figure 17:
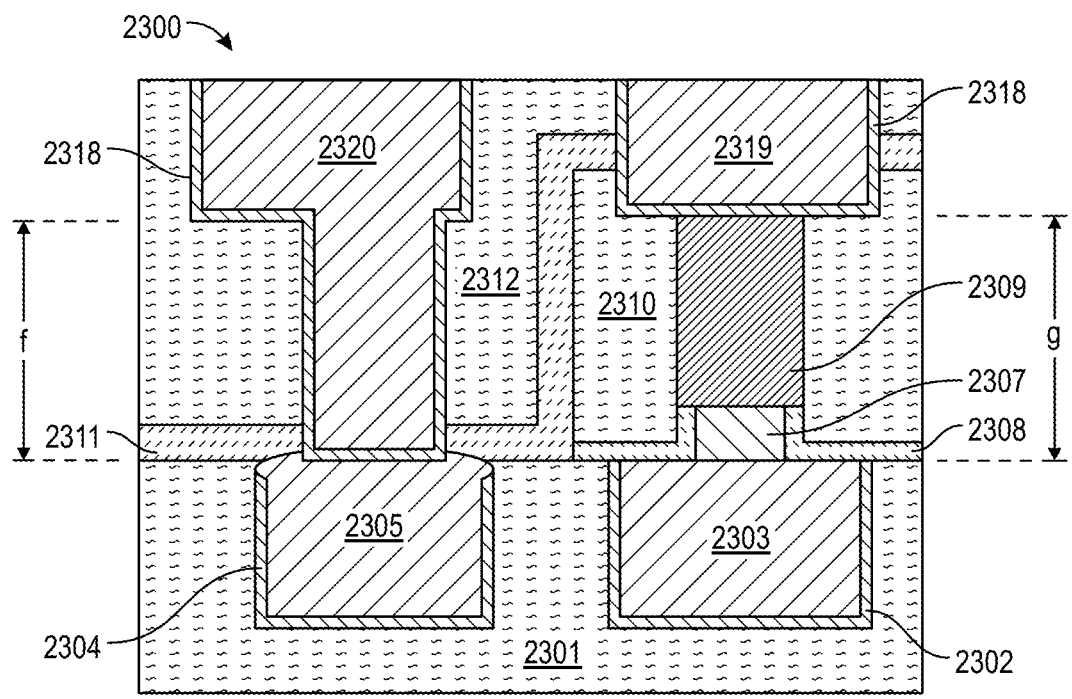
FIG. 17 depicts in a schematic an integrated circuit that includes a device and a vertically offset interconnect with an intervening dielectric cap layer, according to an exemplary embodiment.

FIG. 17 depicts in a schematic an integrated circuit 2300 that includes a device 2309 and a vertically offset interconnect 2320 with an intervening dielectric cap layer 2311, according to an exemplary embodiment. The circuit 2300 is built on a first dielectric layer 2301 and includes a first bottom interconnect 2303 within a first metal liner 2302, a second bottom interconnect 2305 within a second metal liner 2304, a metal plug 2307, and an insulator layer 2308. As in FIGS. 3 and 4, the second bottom interconnect 2305 is formed after the device 2309 has been fabricated. The circuit 2300 also includes a first interlayer dielectric (ILD) 2310 that encapsulates the device 2309 and a second ILD 2312. The dielectric cap layer 2311 separates the ILDs 2310, 2312. An upper metal liner 2318 is formed in the ILDs 2310, 2312 (indeed, a portion of the upper metal liner 2318 penetrates the dielectric cap layer 2311 to contact the device 2309) and first and second upper interconnects 2319, 2320 are formed in the separate portions of the upper metal liner 2318. An interlayer dimension "f" of the second upper interconnect 2320 differs from an interlayer dimension "g" defined by the combined heights of the device 2309 and of the metal plug 2307. One implication of this difference in layer heights is that multiple layers of interconnect (logic layers) can be put down next to a single device.

FIG. 18 depicts in a schematic an integrated circuit 2400 that includes a device 2409 and a vertically offset interconnect 2420 with a uniformly thick insulator layer 2408 and an intervening dielectric cap layer 2411, according to an exemplary embodiment. The circuit 2400 is formed on a first dielectric layer 2401 and includes first and second metal liners 2402, 2404 in which first and second bottom interconnects 2403, 2405 are formed. A bottom side of the first bottom interconnect 2403 is lower than a bottom side of the second bottom interconnect 2405. Additionally, a top side of the first bottom interconnect 2403 is lower than a top side of the second bottom interconnect 2405. Thus, the first bottom interconnect 2403 is below the insulator layer 2408 while the second bottom interconnect 2405 protrudes through the insulator layer 2408. In one or more embodiments, having the second bottom interconnect 2405 protrude through the insulator layer 2408 enables decoupled processing on the interconnect side compared to the device side. A first interlayer dielectric 2410 encapsulates the device 2409 and the dielectric cap layer 2411 separates the first ILD 2410 from a second ILD 2412. An upper metal liner 2418 is formed in the second ILD 2412 and penetrates the dielectric cap layer 2411 above the device 2409. A first upper interconnect 2419 is formed in the upper metal liner 2418 and electrically contacts the device 2409. The vertically offset interconnect 2420 also is formed in the upper metal liner 2418 and penetrates the dielectric cap layer 2411 to electrically contact the second bottom interconnect 2405.

Figure 19:
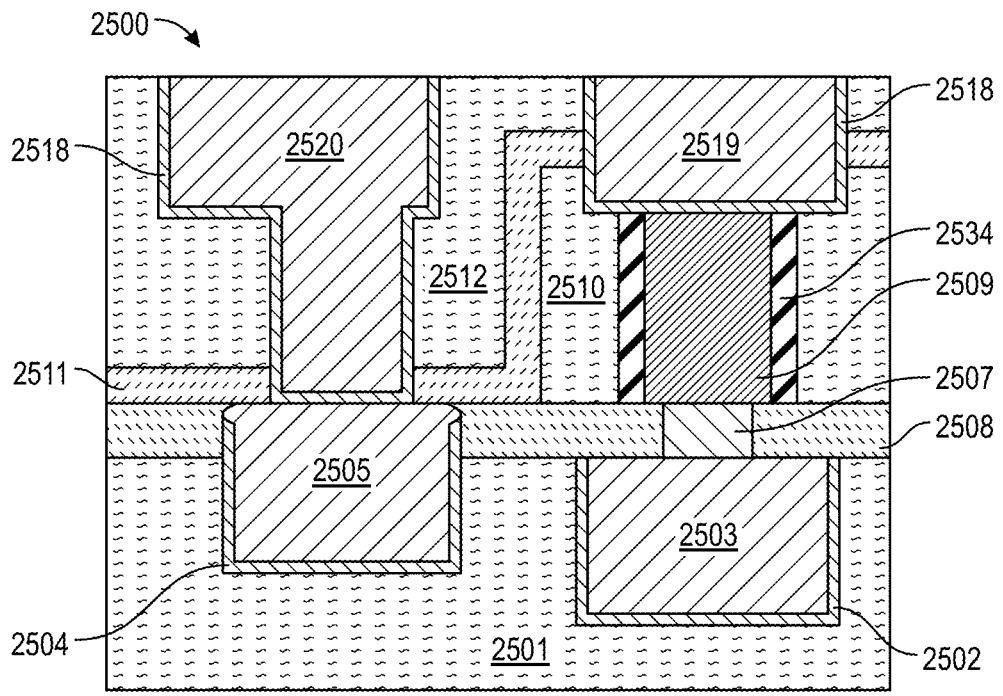
FIG. 19 depicts in a schematic an integrated circuit that includes a device and a vertically offset interconnect with a uniformly thick insulator layer, an intervening dielectric cap layer, and an insulator sheathing the device, according to an exemplary embodiment.

FIG. 19 depicts in a schematic an integrated circuit 2500 that includes a device 2509 and a vertically offset interconnect 2520 with a uniformly thick insulator layer 2508, an intervening dielectric cap layer 2511, and an insulator 2534 sheathing the device, according to an exemplary embodiment. The circuit 2500 is built on a first dielectric layer 2501, and also includes first and second metal liners 2502, 2504 that are filled with first and second bottom interconnects 2503, 2505. A bottom side of the first bottom interconnect 2503 is lower than a bottom side of the second bottom interconnect 2505. Additionally, a top side of the first bottom interconnect 2503 is lower than a top side of the second bottom interconnect 2505. Thus, the first bottom interconnect 2503 is below the insulator layer 2508 while the second bottom interconnect 2505 protrudes through the insulator layer 2508. This configuration has similar benefits as in FIG. 24. A metal plug 2507 electrically connects the first bottom interconnect 2503 to the device 2509. A first interlayer dielectric (ILD) 2510 encapsulates the insulator 2534 and the device 2509, and the dielectric cap layer 2511 separates the first ILD 2510 from a second ILD 2512. A first upper interconnect 2519 and the vertically offset interconnect 2520 are formed in an upper metal liner 2518 that is formed in the second ILD 2512. The first upper interconnect 2519 penetrates the dielectric cap layer 2511 to electrically contact the device 2509, and the vertically offset interconnect 2520 penetrates the dielectric cap layer to electrically contact the second bottom interconnect 2505.

Figure 20:
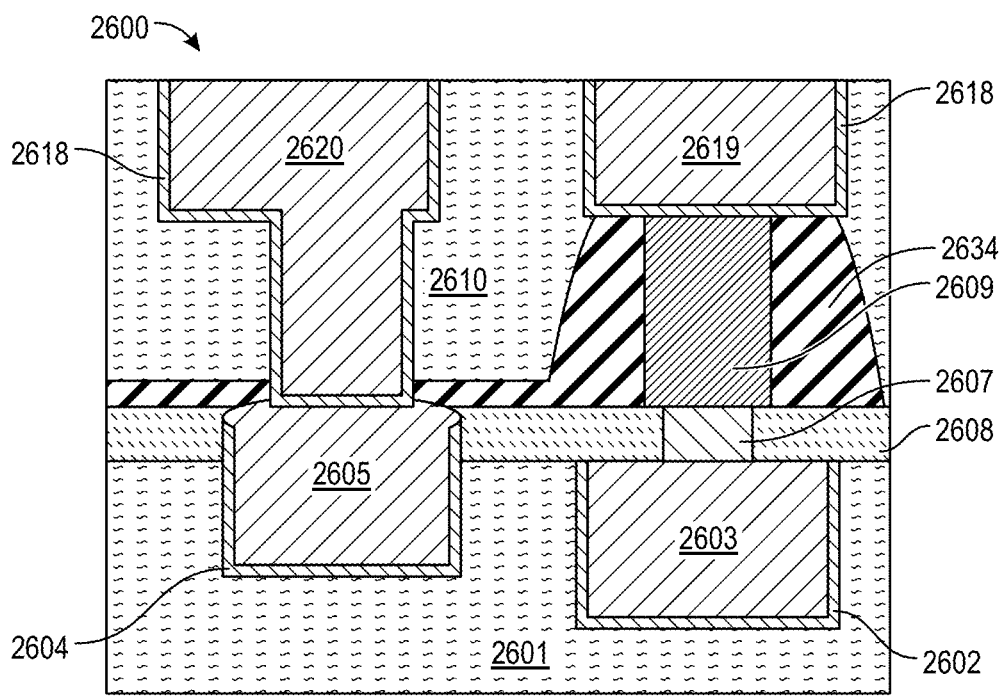
FIG. 20 depicts in a schematic an integrated circuit that includes a device and a vertically offset interconnect with a uniformly thick insulator layer and an insulator sheathing the device, according to an exemplary embodiment.

FIG. 20 depicts in a schematic an integrated circuit 2600 that includes a device 2609 and a vertically offset interconnect 2620 with a uniformly thick insulator layer 2608 and an insulator 2634 sheathing the device, according to an exemplary embodiment. The insulator layer 2608 and the insulator 2634 have moderate k value (e.g., k between about 4 and about 7) and may be made of the same material, but in one or more embodiments they are put down in separate process steps because the device 2609 is formed before the insulator 2634 is put down to encapsulate it. Further, in one or more embodiments the portion of the insulator 2634 to the left of the device 2609 (i.e. overlying the second bottom interconnect 2605) is formed after the second bottom interconnect is formed. The circuit 2600 is built on a first dielectric layer 2601 and also includes a first metal liner 2602, a first bottom interconnect 2603, a second metal liner 2604, and a second bottom interconnect 2605. A bottom side of the first bottom interconnect 2603 is lower than a bottom side of the second bottom interconnect 2605. Additionally, a top side of the first bottom interconnect 2603 is lower than a top side of the second bottom interconnect 2605. Thus, the first bottom interconnect 2603 is below the insulator layer 2608 while the second bottom interconnect 2605 protrudes through the insulator layer 2608. This configuration has similar benefits as in FIG. 24. A metal plug 2607 electrically connects the first bottom interconnect 2602 with the device 2609. A first interlayer dielectric 2610 encapsulates the device 2609 and the insulator 2634. The insulator 2634 extends across the insulator layer 2608 to cover the second bottom interconnect 2605. The vertically offset interconnect 2620 penetrates the insulator 2634 to electrically contact the second bottom interconnect 2605. The vertically offset interconnect 2620 and a first upper interconnect 2619, which electrically contacts the device 2609, are formed in an upper metal liner 2618.

There are numerous techniques used by those skilled in the art to remove material at various stages of creating a semiconductor structure. As used herein, these processes are referred to generically as "etching." For example, etching includes techniques of wet etching, dry etching, chemical oxide removal (COR) etching, and reactive ion etching (RIE), which are all known techniques to remove select material when forming a semiconductor structure. The techniques and application of etching are well understood by those skilled in the art and, as such, a more detailed description of such processes is not presented herein.

Although the overall fabrication method is novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., Silicon VLSI Technology: Fundamentals, Practice, and Modeling 1st Edition, Prentice Hall, 2001 and P. H. Holloway et al., Handbook of Compound Semiconductors: Growth, Processing, Characterization, and Devices, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more layers of a type commonly used in such integrated circuit devices may not be explicitly shown in a given figure for ease of explanation. This does not imply that the layer(s) not explicitly shown are omitted in the actual integrated circuit device.

Given the discussion thus far, it will be appreciated that, in general terms, an exemplary method, according to an aspect of the invention, includes at 402 forming a first bottom interconnect in a device area of a first dielectric layer and fabricating a device on top of the first bottom interconnect; at 404 capping the device with a first interlayer dielectric; at 406 exposing a logic area of the first dielectric that is adjacent to the device area by removing a portion of the first interlayer dielectric from the first dielectric layer while leaving another portion of the first interlayer dielectric that caps the device; and at 422 forming a second bottom interconnect in the logic area of the first dielectric layer.

In one or more embodiments, forming the second bottom interconnect comprises: at 408 depositing a first organic planarization layer (OPL) in the logic area; forming a trench in the first dielectric layer by lithographic patterning the first OPL then etching the first OPL and the first dielectric layer; at 412 forming a metal liner in the trench; and at 422 filling the metal liner with interconnect metal. In one or more embodiments, forming the metal liner comprises: at 410 ashing the first OPL; at 412 depositing the metal liner in the trench and on the logic area; at 414 depositing a second OPL over the metal liner; at 416 etching back the second OPL; at 418 and 420 etching portions of the metal liner outside the trench; and at 422 ashing the second OPL in the trench.

In one or more embodiments, the exemplary method also comprises: depositing a first dielectric cap layer 311 over the second bottom interconnect 305 and the first interlayer dielectric 310; depositing a second interlayer dielectric 312 over the first dielectric cap layer; and forming a third interconnect 314 in the second interlayer dielectric. In one or more embodiments, forming the third interconnect comprises: etching a hole 329 in the second interlayer dielectric; forming a metal liner 313 in the hole; and filling the metal liner with interconnect metal.

In one or more embodiments, the exemplary method also includes depositing a third interlayer dielectric 316 and forming first and second upper interconnects 319, 320 in the third interlayer dielectric. In one or more embodiments, forming the first upper interconnect comprises: etching holes 330, 332 into the third interlayer dielectric; depositing a metal liner 318 into the holes; and filling the metal liner with interconnect metal.

According to another aspect, an exemplary semiconductor apparatus includes a first dielectric layer 301 that has a device area 341 and a logic area 321 adjacent to the device area; a first bottom interconnect 303 formed in the device area 341 of the first dielectric layer; a device 309 on top of the first bottom interconnect; a first interlayer dielectric 310 capping the device but not covering the logic area; and a second bottom interconnect 305 formed in the first dielectric layer in the logic area. The distance from the first bottom interconnect to the top of the first interlayer dielectric defines a device layer of the apparatus.

In one or more embodiments, the exemplary apparatus also includes a first dielectric cap layer 311 covering the second bottom interconnect 305, a second interlayer dielectric 312 covering the first dielectric cap layer, and a third interconnect 314 formed in the second interlayer dielectric above and in contact with the second bottom interconnect, wherein the third interconnect is in the device layer.

In one or more embodiments, the third interconnect includes a narrowed portion adjacent to the bottom interconnect and a widened portion distal from the bottom interconnect, both portions being in the device layer.

In one or more embodiments, the apparatus also includes a second dielectric cap layer 315 covering the third interconnect 314, a third interlayer dielectric 316 covering the second dielectric cap layer, and a first upper interconnect 320 formed in the third interlayer dielectric and in contact with the third interconnect. The first upper interconnect 320 is at least partially in the device layer. In one or more embodiments, the apparatus also includes a second upper interconnect 319 formed in the third interlayer dielectric 316 and in contact with the device 309. The second upper interconnect 319 is in an upper layer of the apparatus and the first upper interconnect 320 is at least partially in the upper layer.

In one or more embodiments, the second bottom interconnect 305 protrudes upward from the first dielectric layer 301 into the device layer.

In one or more embodiments, the apparatus also includes an insulator layer 308 between the first bottom interconnect 303 and the device 309 and a metal plug 307 that penetrates the insulator layer to place the first bottom interconnect in electrical contact with the device.

According to another aspect, an exemplary semiconductor apparatus includes a first dielectric layer 301 that has a device area 341 and a logic area 321 adjacent to the device area; a first bottom interconnect 303 formed in the device area; a device 309 on top of the first bottom interconnect; a first interlayer dielectric 310 capping the device; and a stack of interconnects 314 formed above the logic area adjacent the device. The distance from the first bottom interconnect to the top of the first interlayer dielectric defines a device layer of the apparatus. The stack of interconnects comprises multiple layers of interconnects and dielectric caps within the device layer.

In one or more embodiments, the apparatus also includes a first upper interconnect 319 overlying the device and in electrical contact with the device 309 and a second upper interconnect 320 overlying the stack of interconnects 314 and in electrical contact with an uppermost one of the stack of interconnects. The first and second upper interconnects are formed in an upper interlayer dielectric 316.

In one or more embodiments, the apparatus also includes an insulator layer 308 between the device 309 and the first bottom interconnect 303 and a metal plug 307 that places the device in electrical contact with the first bottom interconnect by penetrating the insulator layer.

In one or more embodiments, the apparatus also includes an insulator 2534 or 2634 encapsulating the device.

In one or more embodiments, the insulator and the dielectric cap layers comprise moderate k materials. In one or more embodiments, the interlayer dielectrics comprise low k materials.

Terms such as "first," "second," etc. were chosen to arbitrarily indicate different but similar components, and do not limit such components being provided in any particular order. For example, although a component in the disclosure is described as a "first" component, other similar components might already be present in the overall structure prior to performance of the steps described herein. Furthermore, although "first" and "second" components generally are similar, they are not limited to being identical in structure or composition. Terms such as "on top" or "atop" or "underlying" indicate relative positions but do not require that the finished product should be arranged in any particular orientation. Generally, "on top" means that there may be intervening material whereas "directly on top" would mean there is no intervening material.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
    a first dielectric layer that has a device area and a logic area adjacent to the device area;
    a first bottom interconnect formed in the device area of the first dielectric layer;
    a device on top of the first bottom interconnect;
    a second bottom interconnect formed in the first dielectric layer in the logic area;
    a first interlayer dielectric capping the device but not covering the logic area, wherein a distance from the first bottom interconnect to the top of the first interlayer dielectric defines a device layer of the apparatus;
    a second interlayer dielectric covering the logic area within the device layer; and
    a first dielectric cap layer covering the first interlayer dielectric, underlying the second interlayer dielectric, and horizontally separating the first interlayer dielectric from a second interlayer dielectric, within the device layer.

2. The apparatus of claim 1, wherein the first dielectric cap layer covers the second bottom interconnect, further comprising a third interconnect formed in the second interlayer dielectric above and in contact with the second bottom interconnect, wherein the third interconnect is in the device layer.

3. The apparatus of claim 2 wherein the third interconnect includes a narrowed portion adjacent to the second bottom interconnect and a widened portion distal from the second bottom interconnect, both portions being in the device layer.

4. The apparatus of claim 2 further comprising a second dielectric cap layer covering the third interconnect, a third interlayer dielectric covering the second dielectric cap layer, and a first upper interconnect formed in the third interlayer dielectric and in contact with the third interconnect, wherein the first upper interconnect is at least partially in the device layer.

5. The apparatus of claim 4 further comprising a second upper interconnect formed in the third interlayer dielectric and in contact with the device, wherein the second upper interconnect is in an upper layer of the apparatus and the first upper interconnect is at least partially in the upper layer.

6. The apparatus of claim 1 further comprising an insulator layer between the first bottom interconnect and the device and a metal plug that penetrates the insulator layer to place the first bottom interconnect in electrical contact with the device.

7. An apparatus comprising:
a first dielectric layer that has a device area and a logic area adjacent to the device area;
a first bottom interconnect formed in the device area of the first dielectric layer;
a device on top of the first bottom interconnect;
a first interlayer dielectric capping the device but not covering the logic area, wherein a distance from the first bottom interconnect to the top of the first interlayer dielectric defines a device layer of the apparatus; and
a second bottom interconnect formed in the first dielectric layer in the logic area,
wherein the second bottom interconnect protrudes upward from the first dielectric layer into the device layer.

8. An apparatus comprising:
a first dielectric layer that has a device area and a logic area adjacent to the device area;
a first bottom interconnect formed in the device area;
a device on top of the first bottom interconnect;
a first interlayer dielectric capping the device, wherein a distance from the first bottom interconnect to the top of the first interlayer dielectric defines a device layer of the apparatus; and
a stack of interconnects formed above the logic area adjacent the device, wherein the stack of interconnects comprises multiple layers of interconnects and dielectric caps within the device layer.

9. The apparatus of claim 8 further comprising a first upper interconnect overlying the device and in electrical contact with the device and a second upper interconnect overlying the stack of interconnects and in electrical contact with an uppermost one of the stack of interconnects, wherein the first and second upper interconnects are formed in an upper interlayer dielectric.

10. The apparatus of claim 8 further comprising an insulator layer between the device and the first bottom interconnect and a metal plug that places the device in electrical contact with the first bottom interconnect by penetrating the insulator layer.

11. The apparatus of claim 8 further comprising an insulator encapsulating the device.

12. The apparatus of claim 11 wherein the insulator and the dielectric cap layers comprise moderate k materials.

13. The apparatus of claim 12 wherein the interlayer dielectrics comprise low k materials.

* * * * *